(12) United States Patent
Zhou et al.

(10) Patent No.: US 11,046,904 B2
(45) Date of Patent: Jun. 29, 2021

(54) APPARATUS FOR GROWING HYDRATE CRYSTALS

(71) Applicant: GUANGZHOU INSTITUTE OF ENERGY CONVERSION, CHINESE ACADEMY OF SCIENCES, Guangzhou (CN)

(72) Inventors: Xuebing Zhou, Guangzhou (CN); Deqing Liang, Guangzhou (CN); Zhen Long, Guangzhou (CN); Xiaodong Shen, Guangzhou (CN)

(73) Assignee: GUANGZHOU INSTITUTE OF ENERGY CONVERSION, CHINESE ACADEMY OF SCIENCES, Guangzhou (CN)

( * ) Notice: Subject to any disclaimer, the term of this patent is extended or adjusted under 35 U.S.C. 154(b) by 341 days.

(21) Appl. No.: 16/336,911

(22) PCT Filed: Dec. 27, 2017

(86) PCT No.: PCT/CN2017/118899
§ 371 (c)(1),
(2) Date: Mar. 27, 2019

(87) PCT Pub. No.: WO2019/080348
PCT Pub. Date: May 2, 2019

(65) Prior Publication Data
US 2020/0318022 A1    Oct. 8, 2020

(30) Foreign Application Priority Data

Dec. 7, 2017 (CN) .......................... 201711288593.6

(51) Int. Cl.
*B01J 19/00* (2006.01)
*B01J 19/08* (2006.01)
(Continued)

(52) U.S. Cl.
CPC ........... *C10L 3/108* (2013.01); *B01J 19/0013* (2013.01); *B01J 19/08* (2013.01); *C30B 7/00* (2013.01);
(Continued)

(58) Field of Classification Search
CPC ....... B01J 3/00; B01J 3/06; B01J 3/062; B01J 19/00; B01J 19/0006; B01J 19/0013;
(Continued)

(56) References Cited

U.S. PATENT DOCUMENTS

2012/0082590 A1* 4/2012 Lee .......................... B01J 19/24
422/109

FOREIGN PATENT DOCUMENTS

CN          107345894 A    * 11/2017

* cited by examiner

*Primary Examiner* — Natasha E Young
(74) *Attorney, Agent, or Firm* — Bayramoglu Law Offices LLC (57) ABSTRACT

An apparatus for growing hydrate crystals includes a high-pressure-resistant crystallization vessel, a temperature control system, a pressure control system, a data collection system, and a mobile shelf. The apparatus can realize a variety of experimental methods such as the bubble method, the droplet method and the solution growth method by changing the experimental fitting in the high-pressure-resistant crystallization vessel, and thereby-improve the versatility of the device.

7 Claims, 6 Drawing Sheets

(51) Int. Cl.
  *B01J 19/12* (2006.01)
  *B01J 19/24* (2006.01)
  *C10L 3/10* (2006.01)
  *C30B 7/00* (2006.01)

(52) U.S. Cl.
  CPC .............. *B01J 2219/00051* (2013.01); *B01J 2219/00162* (2013.01)

(58) Field of Classification Search
  CPC . B01J 19/08; B01J 19/12; B01J 19/121; B01J 19/24; B01J 2219/00; B01J 19/00049; B01J 19/00051; B01J 19/00074; B01J 19/00087; B01J 19/00094; B01J 19/00162; C10L 3/00; C10L 3/06; C10L 3/10; C10L 3/108; C30B 7/00; C30B 7/10
  See application file for complete search history.

APPARATUS FOR GROWING HYDRATE CRYSTALS

CROSS REFERENCE TO THE RATED APPLICATIONS

This application is the national phase entry of International Application No. PCT/CN2017/118899, now WO 2019/080348, filed on Dec. 27, 2017, which is based upon and claims priority to Chinese Patent Application No. 201711288593.6, filed on Dec. 7, 2017, the entire contents of which are incorporated herein by reference.

TECHNICAL FIELD

The present invention relates to the technical field of devices for growing crystals, and particularly to an apparatus for growing hydrate crystals.

BACKGROUND

Gas hydrates are clathrate, ice-like and crystalline compounds, which are formed by the combination of gas molecules and water molecules under low temperature and high pressure. Naturally formed gas hydrates are widely distributed in deep sea sediments or the permafrost regions. As natural gas hydrates have been found globally in recent years, they have become an alternative energy source with great development potential and attracted the attention of countries all over the world. At present, the world's proven reserves of natural gas hydrates have reached $2.1 \times 10^{16}$ m$^3$, which are more than twice of the total amount of traditional fossil fuel. Meanwhile, gas hydrates have a high gas storage density that one standard volume of gas hydrate can store up to 160 standard volumes of gas, while the temperature and pressure conditions required for storage are milder than those of liquefied gases, thus gas hydrates can be widely used in the storage and transportation of natural gas and the fixation and storage of carbon dioxide. Accordingly, studying the kinetic characteristics and related mechanisms of gas hydrates is of great significance for realizing the exploitation, storage and transportation of natural gas hydrates and the capture and storage of greenhouse gases.

Gas hydrates are unstable under normal temperature and pressure conditions and are easily decomposed into gas and liquid water, while maintaining a stable hydrate crystal structure requires lower temperatures and higher pressures. For example, at 1° C., the minimum pressure required for maintaining a stable methane gas hydrate crystal structure is about 2.9 MPa. Thus, under normal conditions of room temperature and one atmosphere, it is difficult to measure hydrate-related physical properties and crystal properties. Meanwhile, the porousness and non-stoichiometric properties of gas hydrates, and the sensitivity of crystal structures to gas pressures, make it difficult for single gas hydrate crystals to grow to macroscopic and measurable sizes; thus it is more difficult to perform measurement on single crystals of gas hydrates, hindering the study on the growth kinetics of hydrate crystals in solutions. In order to allow the research and breakthrough of gas hydrate in the field of crystallography, there is a need to improve the existing devices.

At present, some research institutions in the world have developed devices for growing gas hydrate crystals. These devices can realize the study on the growth kinetics of gas hydrate crystals or the production of single crystals under the conditions below 4 MPa and 10° C. Meanwhile, for some reasons such as the small volume of these devices or improper configuration of light sources, their experimental results are not very convincing. Thus, how to improve the pressure resistance of devices, extend the application of the devices to different crystallographic research methods, and improve the configuration of light sources and camera devices in the devices for growing gas hydrate crystals, are vital challenges for realizing in-situ measurement of gas hydrate crystal structure for further experimental analysis of hydrate crystals.

SUMMARY

The present invention provides an apparatus for growing hydrate crystals, in order to realize versatility and provide higher precision and accuracy in measurement.

In order to realize the above object, the technical solutions of the present invention are as follows.

An apparatus for growing hydrate crystals, comprising a mobile shelf, a temperature control system, a pressure control system, a data collection system, and a high-pressure-resistant crystallization vessel; the high-pressure-resistant crystallization vessel, the temperature control system, the pressure control system, and the data collection system are disposed on the mobile shelf;

the high-pressure-resistant crystallization vessel comprises a high-pressure-resistant crystallization vessel body; an incident laser beam window cover is provided at an upper end of the high-pressure-resistant crystallization vessel body, a high-pressure-resistant crystallization vessel fixing support is provided at a lower end of the high-pressure-resistant crystallization vessel body, and a high-pressure-resistant chamber is provided inside the high-pressure-resistant crystallization vessel body; an incident laser beam window glass is provided below the incident laser beam window cover; a gas inlet and a gas outlet of the high-pressure-resistant chamber are respectively provided at two sides of the incident laser beam window glass; the gas inlet is connected to an elongated air intake pipe; a coolant jacket is provided outside the high-pressure-resistant chamber; a coolant inlet and a coolant outlet are provided at a center of a bottom of the coolant jacket; a specimen stage is provided at a bottom of a lateral wall of the high-pressure-resistant chamber; high-pressure-resistant chamber window glasses are symmetrically provided at two side of the high-pressure-resistant chamber; high-pressure-resistant chamber window covers are provided outside the high-pressure-resistant chamber window glasses;

the temperature control system comprises a low-temperature thermostatic bath and coolant hoses; the low-temperature thermostatic bath is connected to the high-pressure-resistant crystallization vessel via the coolant hoses; a high-pressure-resistant crystallization vessel thermocouple thermometer and a high-pressure-resistant crystallization vessel pressure sensor are provided at an upper end of the high-pressure-resistant crystallization vessel;

the pressure control system comprises high-pressure hoses, a vacuum pump needle valve, a gas intake buffer tank, a gas discharge buffer tank, and a vacuum pump; the high-pressure-resistant crystallization vessel is connected to the gas intake buffer tank and the gas discharge buffer tank through the high-pressure hoses, and the high-pressure hoses are respectively provided with a gas inlet needle valve and a gas outlet needle valve; a bypass needle valve is provided between the gas intake buffer tank and the gas discharge buffer tank; the vacuum pump is connected to the gas outlet needle valve through the vacuum pump needle valve; the gas intake buffer tank is provided with a gas intake buffer tank pressure sensor and a gas intake buffer tank thermocouple thermometer; the gas discharge buffer tank is provided with a gas discharge buffer tank thermocouple thermometer and a gas discharge buffer tank pressure sensor;

the data collection system comprises the thermocouple thermometers and the pressure sensors; the mobile shelf is provided with a paperless recorder; the thermocouple thermometers and the pressure sensors transmit data to the paperless recorder; a precise positioning stage is provided at the front of the high-pressure-resistant crystallization vessel; the precise positioning stage is provided with a camera.

Furthermore, the mobile shelf has a frame made of aluminum alloy, and its remaining components are made of stainless steel plate material.

Furthermore, the high-pressure-resistant crystallization vessel fixing support has a hollow structure; the low-temperature thermostatic bath is connected to the high-pressure-resistant crystallization vessel via the coolant hoses passing through the hollow structure of the high-pressure-resistant crystallization vessel fixing support.

Furthermore, the specimen stage is a detachable component; the specimen stage is made of brass and has an "I" shape; an upper surface of the specimen stage is coated with a layer of polytetrafluoroethylene material; a bottom of the specimen stage is fitted to a bottom surface of the high-pressure-resistant chamber and provide with a cylindrical locating pin.

Furthermore, the elongated air intake pipe is a detachable component; the elongated air intake pipe is made of stainless steel material.

Furthermore, two lateral glasses of the mobile shelf and facing the high-pressure-resistant crystallization vessel are electric liquid-crystal switchable glasses.

Furthermore, the high-pressure-resistant crystallization vessel and the high-pressure-resistant chamber therein are of a flat cylindrical shape.

The apparatus has the following advantages. By considering the current experimental methods for hydrate crystal research, the apparatus of the present invention can realize a variety of experimental methods such as the bubble method, the droplet method and the solution growth method by changing the experimental fitting in the high-pressure-resistant crystallization vessel, and thereby improve the versatility of the device. Secondly, in view of the defects of the traditional devices for growing gas hydrate crystals such as low observation accuracy and low pressure-resistance, by the present invention, the insulation performance of the crystallization vessel enclosure structure against the heat conduction and heat radiation from the external environment is improved, the pattern of the incident beam from the background light source in the crystallization vessel has been modified and the incident performance has been improved, the two-dimensional remote-controlled movement of the camera is realized, and the pressure resistance and low-temperature resistance of the crystallization vessel have been improved. These improvements allow a more accurate measurement of hydrate crystals which is suitable for more kinds of methods.

Reference signs: 1: mobile shelf; 2: paperless recorder; 3: low-temperature thermostatic bath, 4: observation housing; 5: high-pressure-resistant crystallization vessel; 6: coolant hoses; 7: high-pressure-resistant crystallization vessel thermocouple thermometer; 8: vacuum pump; 9: high-pressure hose; 10: gas outlet needle valve; 11: gas inlet needle valve; 12: high-pressure-resistant crystallization vessel pressure sensor; 13: camera; 14: precise positioning stage; 15: vacuum pump needle valve; 16: gas intake buffer tank pressure sensor; 17: gas intake buffer tank thermocouple thermometer; 18: gas intake buffer tank; 19: bypass needle valve; 20: gas discharge buffer tank; 21: gas discharge buffer tank thermocouple thermometer; 22: gas discharge buffer tank pressure sensor; 5a: incident laser beam window cover; 5b: high-pressure-resistant crystallization vessel fixing support; 5c: incident laser beam window glass; 5d: high-pressure-resistant crystallization vessel body; 5e: high-pressure-resistant chamber window covers; 5f: high-pressure-resistant chamber window glasses; 5x: high-pressure-resistant chamber; 5y: coolant jacket.

DETAILED DESCRIPTION OF THE EMBODIMENTS

The present invention will be further described in detail below with reference to the drawings and embodiments.

Embodiment 1

Figure 2:
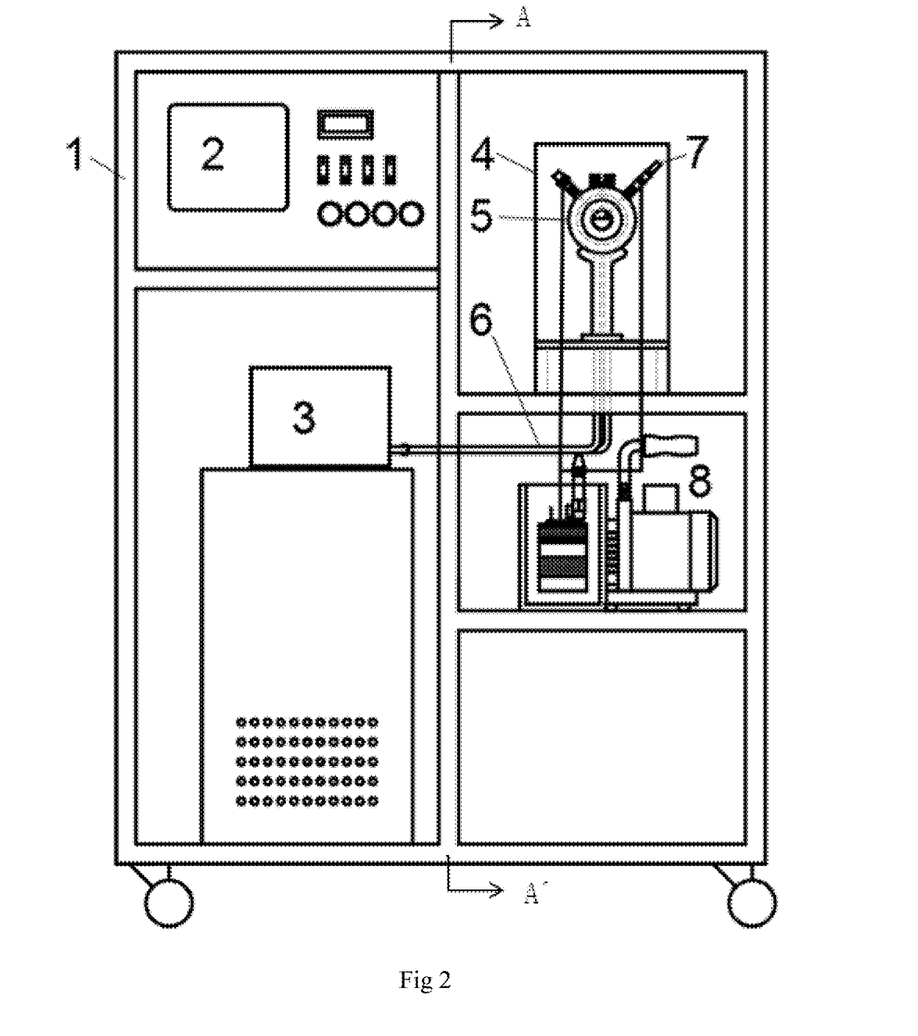
FIG. 2 is a schematic diagram showing the structure of the present invention.
Figure 3:
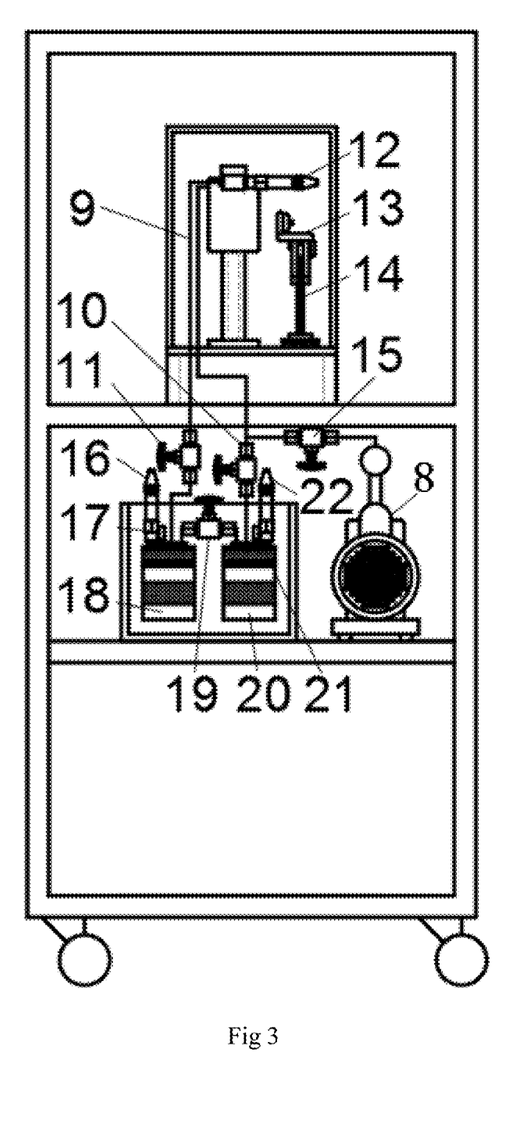
FIG. 3 is a cross-sectional view taken along line A-A of FIG. 2.

An apparatus for growing hydrate crystals, comprising a mobile shelf 1, a temperature control system, a pressure control system, a data collection system, and a high-pressure-resistant crystallization vessel 5; the high-pressure-resistant crystallization vessel 5, the temperature control system, the pressure control system, and the data collection system are disposed on the mobile shelf 1.

Figure 4:
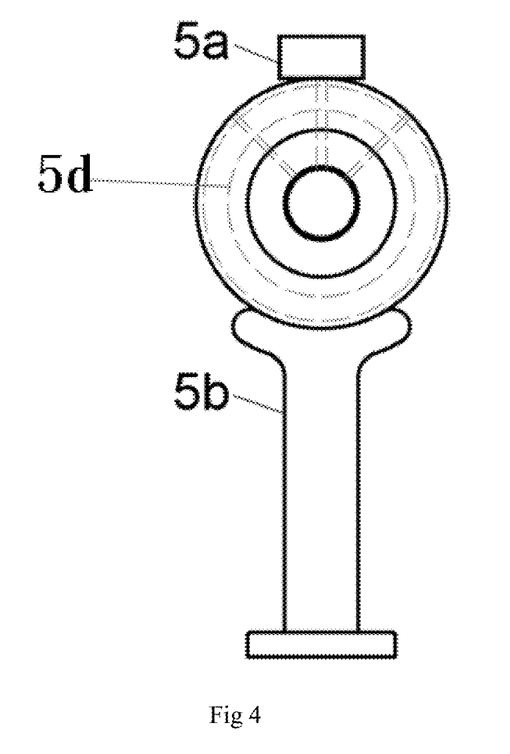
FIG. 4 is a schematic diagram showing the external structure of the high-pressure-resistant crystallization vessel.
Figure 5:
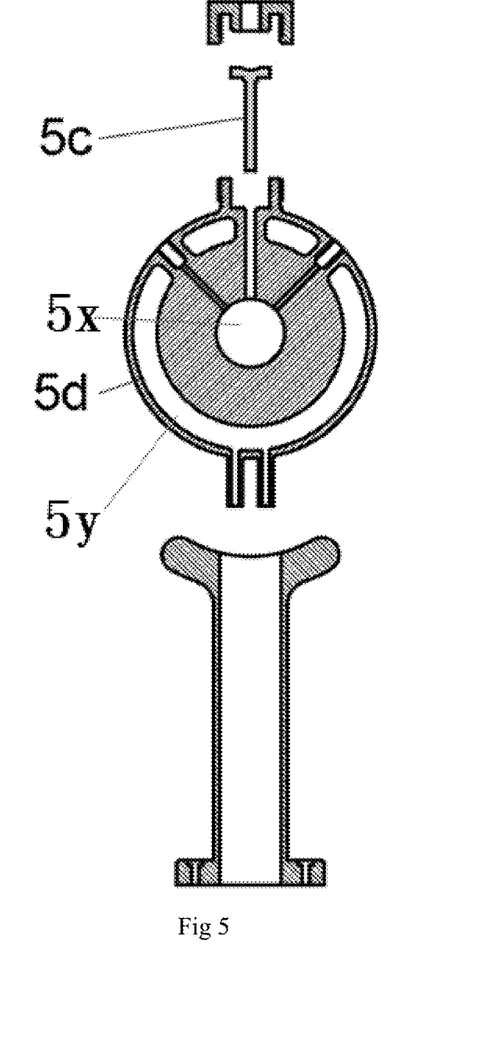
FIG. 5 is a schematic diagram showing the internal structure of the high-pressure-resistant crystallization vessel.
Figure 6:
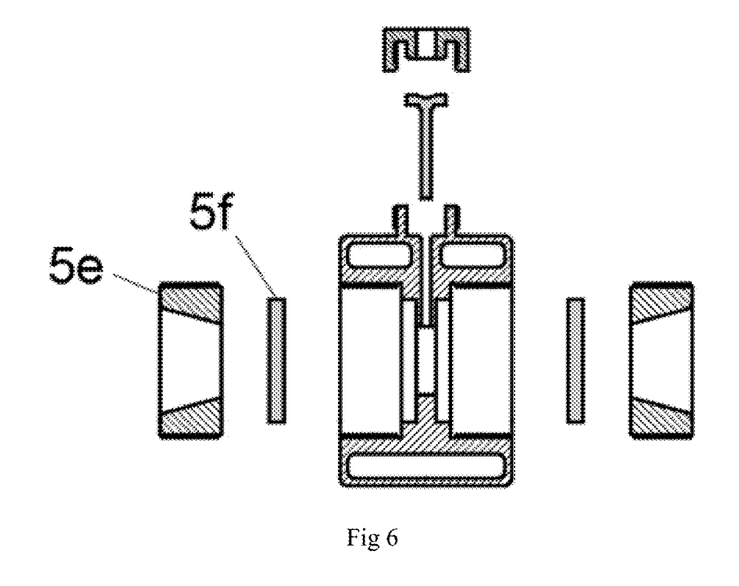
FIG. 6 is a schematic diagram showing the structure of the high-pressure-resistant chamber.

The high-pressure-resistant crystallization vessel 5 comprises a high-pressure-resistant crystallization vessel body 5d; an incident laser beam window cover 5a is provided at an upper end of the high-pressure-resistant crystallization vessel body 5d, a high-pressure-resistant crystallization vessel fixing support 5b is provided at a lower end of the high-pressure-resistant crystallization vessel body 5d, and a high-pressure-resistant chamber 5x is provided inside the high-pressure-resistant crystallization vessel body 5d; an incident laser beam window glass 5c is provided below the incident laser beam window cover 5a; a gas inlet and a gas outlet of the high-pressure-resistant chamber 5x are respectively provided at two sides of the incident laser beam window glass 5c; the gas inlet is connected to an elongated air intake pipe; a coolant jacket 5y is provided outside the high-pressure-resistant chamber 5x; a coolant inlet and a coolant outlet are provided at a center of a bottom of the coolant jacket 5y; a specimen stage is provided at a bottom of a lateral wall of the high-pressure-resistant chamber 5x; high-pressure-resistant chamber window glasses 5f are symmetrically provided at two side of the high-pressure-resistant chamber 5x; high-pressure-resistant chamber window covers 5e are provided outside the high-pressure-resistant chamber window glasses 5f.

The temperature control system comprises a low-temperature thermostatic bath 3 and coolant hoses 6; the low-temperature thermostatic bath 3 is connected to the high-pressure-resistant crystallization vessel 5 via the coolant hoses 6; a high-pressure-resistant crystallization vessel thermocouple thermometer 7 and a high-pressure-resistant crystallization vessel pressure sensor 12 are provided at an upper end of the high-pressure-resistant crystallization vessel 5.

The pressure control system comprises high-pressure hoses 9, a vacuum pump needle valve 15, a gas intake buffer tank 18, a gas discharge buffer tank 20, and a vacuum pump 8; the high-pressure-resistant crystallization vessel 5 is connected to the gas intake buffer tank 18 and the gas discharge buffer tank 20 through the high-pressure hoses 9, and the high-pressure hoses 9 are respectively provided with a gas inlet needle valve 11 and a gas outlet needle valve 10; a bypass needle valve 19 is provided between the gas intake buffer tank 18 and the gas discharge buffer tank 20; the vacuum pump 8 is connected to the gas outlet needle valve 10 through the vacuum pump needle valve 15; the gas intake buffer tank 18 is provided with a gas intake buffer tank pressure sensor 16 and a gas intake buffer tank thermocouple thermometer 17; the gas discharge buffer tank 20 is provided with a gas discharge buffer tank thermocouple thermometer 21 and a gas discharge buffer tank pressure sensor 22.

The data collection system comprises the thermocouple thermometers and the pressure sensors; the mobile shelf 1 is provided with a paperless recorder 2; the thermocouple thermometers and the pressure sensors transmit data to the paperless recorder 2; a precise positioning stage 14 is provided at the front of the high-pressure-resistant crystallization vessel 5; the precise positioning stage 14 is provided with a camera 13.

The mobile shelf 1 has a frame made of aluminum alloy, and its remaining components are made of stainless steel plate material. The high-pressure-resistant crystallization vessel fixing support 5b has a hollow structure; the low-temperature thermostatic bath 3 is connected to the high-pressure-resistant crystallization vessel 5 via the coolant hoses 6 passing through the hollow structure of the high-pressure-resistant crystallization vessel fixing support 5b. The specimen stage is a detachable component; the specimen stage is made of brass and has an "I" shape; an upper surface of the specimen stage is coated with a layer of polytetrafluoroethylene material; a bottom of the specimen stage is fitted to a bottom surface of the high-pressure-resistant chamber and provide with a cylindrical locating pin. The elongated air intake pipe is a detachable component; the elongated air intake pipe is made of stainless steel material. Two lateral glasses of the mobile shelf 1 and facing the high-pressure-resistant crystallization vessel 5 are electric liquid-crystal switchable glasses. The high-pressure-resistant crystallization vessel 5 and the high-pressure-resistant chamber 5x therein are of a flat cylindrical shape.

A method of using the apparatus is described by applying the apparatus in a crystal growth experiment of methane hydrate crystals under 2° C. and 4 MPa. The methane gas used in the experiment was purchased from Guangzhou Puyuan Gas Co. Ltd., with a purity of no lower than 99.9%. The water used for forming methane hydrate was distilled water prepared in the laboratory.

The general operation process comprises, in chronological order, the following three segments: Instrument assembly and sample introduction, Crystal growth observation, and Instrument tidying.

Figure 1:
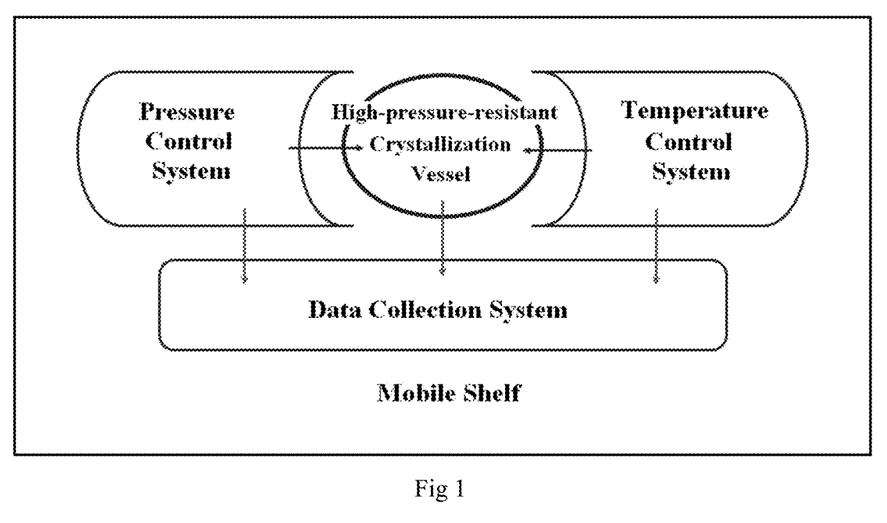
FIG. 1 is a flow chart of the operation procedure of the present invention.

In the segment of Instrument assembly and sample introduction: First, the high-pressure hoses 9 were connected to the gas inlet and the gas outlet of the high-pressure-resistant crystallization vessel 5; the coolant hoses were also connected to the apparatus. The high-pressure-resistant chamber window glasses 5f, which had been wiped, were mounted on the high-pressure-resistant crystallization vessel body 5d, and secured and sealed by the high-pressure-resistant crystallization vessel window covers 5e. 3 mL of pure water was injected using a syringe into the high-pressure-resistant chamber through the incident laser beam window, then the incident laser beam window glass 5c (which had been wiped) was mounted and secured and sealed by the incident laser beam window cover 5a. Then the apparatus was connected to power supply and the camera was examined for its imaging performance. After the assembly and examination of the high-pressure-resistant crystallization vessel 5 were complete, an observation housing 4 was placed over the high-pressure-resistant crystallization vessel 5, and the incident angle of the laser beam was adjusted, so as to realize an optimal level of incidence from the light source.

In the segment of Crystal growth observation: First, the paperless recorder 2 was turned on to check whether the temperature and pressure values in the high-pressure-resistant crystallization vessel 5, gas intake buffer tank 18 and gas discharge buffer tank 20 were distinctly different from the atmospheric temperature and atmospheric pressure. Then, the temperature in the high-pressure-resistant crystallization vessel 5 was controlled by the temperature control system. The circulating pump of the low-temperature thermostatic bath 3 was turned on, and the coolant circulation line was examined to check whether there were leaks. The temperature setting value of the low-temperature thermostatic bath 3 was set to be 1° C., and then the refrigerating system was turned on. When the temperature in the high-pressure-resistant crystallization vessel 5 was stable, the temperature setting value of the low-temperature thermostatic bath 3 was adjusted until the temperature was stable at 2° C. Then, the pressure in the high-pressure-resistant crystallization vessel 5 was adjusted by the pressure control system. A high-pressure gas supply, the bypass needle valve 19, the gas outlet needle valve 10, and the gas inlet needle valve 11 were turned on, so as to purge the chambers of the gas intake buffer tank 18, the gas discharge buffer tank 20 and the high-pressure-resistant crystallization vessel 5. Then, the high-pressure gas supply was turned off, and the vacuum pump needle valve 15 and the vacuum pump 8 were turned on to perform vacuum-pumping. When the temperature and pressure in the gas intake buffer tank 18, the gas discharge buffer tank 20 and the high-pressure-resistant crystallization vessel 5 were stable, the vacuum pump needle valve 15 and the vacuum pump 8 were turned off, and high-pressure gas was slowly introduced into the gas intake buffer tank 18, the gas discharge buffer tank 20 and the high-pressure-resistant crystallization vessel 5. When the pressure in the high-pressure-resistant crystallization vessel 5 reached 3.8 MPa, the bypass needle valve 19 and the gas inlet needle valve 11 were turned off, while gas kept being introduced into the gas intake buffer tank 18 until the pressure therein reached 6 MPa. Then the high-pressure gas supply was turned off, and the gas inlet needle valve 11 was turned on slowly, so as to introduce gas into the high-pressure-resistant crystallization vessel 5 to allow the pressure therein to reach a predetermined value, and eventually the gas inlet needle valve 11 was turned off. At that moment, the solution in the high-pressure-resistant crystallization vessel 5 is supersaturated. Then, the angle of the camera was adjusted through the precise positioning stage 14, and video recording was started. Under normal conditions, gas hydrate crystals grow in a relatively low speed in a still solution, such that it takes several hours or even several days for the crystals to grow. When growing the crystals, the electric liquid-crystal switchable glasses were switched off so as to protect the growing crystals from external radiation. When the solution in the high-pressure-resistant chamber 5x entirely turned into gas hydrate crystals, the growth process was complete. The temperature in the low-temperature thermostatic bath 3 was raised to 8° C., so as to allow the gas hydrate in the high-pressure-resistant chamber 5x to decompose completely. Then, the temperature in the high-pressure-resistant crystallization vessel 5 was reduced to 2° C. again for observation of gas hydrate formation a second time. If the two processes of growing gas hydrate show generally consistent data, then the observation of gas hydrate growth process was complete.

In the segment of Instrument tidying: First, the temperature in the low-temperature thermostatic bath 3 was raised to 8° C., so as to allow the gas hydrate to decompose completely. Then, the gas outlet needle valve 10 and the bypass needle valve 19 on the gas discharge buffer tank 20 were successively turned on, to slowly discharge the methane gas in the vessels. When the pressure was reduced to the atmospheric pressure, the temperature setting value of the low-temperature thermostatic bath 3 was adjusted to be 25° C., and the low-temperature thermostatic bath 3 was turned off. The electric liquid-crystal switchable glasses were switched on, and the observation housing 4 was opened, the incident laser beam window cover 5a was unscrewed, the incident laser beam window glass 5c was taken out, and the solution in the high-pressure-resistant chamber was aspirated using a syringe. The high-pressure-resistant chamber window covers 5e was unscrewed so as to successively detach the high-pressure-resistant chamber window covers 5e and the high-pressure-resistant chamber window glasses 5f, and then the high-pressure-resistant crystallization vessel body 5d and the high-pressure-resistant chamber window glasses 5f were cleaned. Eventually, the paperless recorder 2 was turned off, and thereby the maintenance and tidying process of instrument was complete.

The above embodiments are only intended to illustrate the technical concept and the features of the present invention, in order to enable those skilled in the art to understand the contents of the present invention and to implement the present invention. Equivalent changes or modifications made in accordance with the spirit of the invention are intended to be included within the scope of the invention.

What is claimed is:

1. An apparatus for growing hydrate crystals, comprising: a mobile shelf, a temperature control system, a pressure control system, a data collection system, and a high-pressure-resistant crystallization vessel;
    wherein
    the high-pressure-resistant crystallization vessel, the temperature control system, the pressure control system, and the data collection system are disposed on the mobile shelf;
    the high-pressure-resistant crystallization vessel comprises a high-pressure-resistant crystallization vessel body; an incident laser beam window cover is provided at an upper end of the high-pressure-resistant crystallization vessel body, a high-pressure-resistant crystallization vessel fixing support is provided at a lower end of the high-pressure-resistant crystallization vessel body, and a high-pressure-resistant chamber is provided inside the high-pressure-resistant crystallization vessel body; an incident laser beam window glass is provided below the incident laser beam window cover; a gas inlet and a gas outlet of the high-pressure-resistant chamber are respectively provided at two sides of the incident laser beam window glass; the gas inlet is connected to an elongated air intake pipe; a coolant jacket is provided outside the high-pressure-resistant chamber; a coolant inlet and a coolant outlet are provided at a center of a bottom of the coolant jackets; a specimen stage is provided at a bottom of a lateral wall of the high-pressure-resistant chamber; high-pressure-resistant chamber window glasses are symmetrically provided at two sides of the high-pressure-resistant chamber; a high-pressure-resistant chamber window covers is provided outside each of the high-pressure-resistant chamber window glasses;
    the temperature control system comprises a low-temperature thermostatic bath and a plurality of coolant hoses; the low-temperature thermostatic bath is connected to the high-pressure-resistant crystallization vessel via the plurality of coolant hoses; a high-pressure-resistant crystallization vessel thermocouple thermometer and a high-pressure-resistant crystallization vessel pressure sensor are provided at an upper end of the high-pressure-resistant crystallization vessel;
    the pressure control system comprises a plurality of high-pressure hoses, a vacuum pump needle valve, a gas intake buffer tank, a gas discharge buffer tank, and a vacuum pump; the high-pressure-resistant crystallization vessel is connected to the gas intake buffer tank and the gas discharge buffer tank through the plurality of high-pressure hoses, and each of the plurality of high-pressure hoses is provided with a gas inlet needle valve and a gas outlet needle valve; a bypass needle valve is provided between the gas intake buffer tank and the gas discharge buffer tank; the vacuum pump is connected to the gas outlet needle valve through the vacuum pump needle valve; the gas intake buffer tank is provided with a gas intake buffer tank pressure sensor and a gas intake buffer tank thermocouple thermometer; the gas discharge buffer tank is provided with a gas discharge buffer tank thermocouple thermometer and a gas discharge buffer tank pressure sensor;
    the data collection system comprises the gas intake buffer tank thermocouple thermometer, the gas discharge buffer tank thermocouple thermometer, the high-pressure-resistant crystallization vessel thermocouple thermometer, and the gas intake buffer tank pressure sensor, the gas discharge buffer tank pressure sensor, and the high-pressure-resistant crystallization vessel pressure sensor; the mobile shelf is provided with a paperless recorder; the gas intake buffer tank thermocouple thermometer, the gas discharge buffer tank thermocouple thermometer, the high-pressure-resistant crystallization vessel thermocouple thermometer, the gas intake buffer tank pressure sensor, the gas discharge buffer tank pressure sensor and the high-pressure-resistant crystallization vessel pressure sensor transmit data to the paperless recorder; a precise positioning stage is provided at a front of the high-pressure-resistant crystallization vessel; the precise positioning stage is provided with a camera.

2. The apparatus for growing hydrate crystals according to claim 1, wherein the mobile shelf comprises a frame made of an aluminum alloy, and the rest of the mobile shelf are made of a stainless steel plate material.

3. The apparatus for growing hydrate crystals according to claim 1, wherein the high-pressure-resistant crystallization vessel fixing support comprises a hollow structure; the plurality of coolant hoses pass through the hollow structure of the high-pressure-resistant crystallization vessel fixing support.

4. The apparatus for growing hydrate crystals according to claim 1, wherein the specimen stage is a detachable component; the specimen stage is made of brass and has an "I" shape; an upper surface of the specimen stage is coated with a layer of polytetrafluoroethylene material; a bottom of the specimen stage is fitted to a bottom surface of the high-pressure-resistant chamber.

5. The apparatus for growing hydrate crystals according to claim 1, wherein the elongated air intake pipe is a detachable component; the elongated air intake pipe is made of a stainless steel material.

6. The apparatus for growing hydrate crystals according to claim 1, wherein two lateral glasses of the mobile shelf are electric liquid-crystal switchable glasses, and the two lateral glasses face the high-pressure-resistant crystallization vessel.

7. The apparatus for growing hydrate crystals according to claim 1, wherein each of the high-pressure-resistant crystallization vessel and the high-pressure-resistant chamber therein is of a flat cylindrical shape.

\* \* \* \* \*